US012063053B2

United States Patent
Fujimoto et al.

(10) Patent No.: US 12,063,053 B2
(45) Date of Patent: Aug. 13, 2024

(54) ANALOG-TO-DIGITAL CONVERTER

(71) Applicant: DENSO CORPORATION, Kariya (JP)

(72) Inventors: Yuu Fujimoto, Kariya (JP); Tomohiro Nezuka, Kariya (JP); Kunihiko Nakamura, Kariya (JP)

(73) Assignee: DENSO CORPORATION, Kariya (JP)

( * ) Notice: Subject to any disclaimer, the term of this patent is extended or adjusted under 35 U.S.C. 154(b) by 208 days.

(21) Appl. No.: 17/877,241

(22) Filed: Jul. 29, 2022

(65) Prior Publication Data

US 2022/0368341 A1 Nov. 17, 2022

Related U.S. Application Data

(63) Continuation of application No. PCT/JP2021/000695, filed on Jan. 12, 2021.

(30) Foreign Application Priority Data

Feb. 3, 2020 (JP) .................. 2020-016232

(51) Int. Cl.
*H03M 1/12* (2006.01)
*H03M 3/00* (2006.01)

(52) U.S. Cl.
CPC ............. *H03M 3/46* (2013.01); *H03M 3/464* (2013.01); *H03M 3/424* (2013.01)

(58) Field of Classification Search
CPC ......... H03M 3/46; H03M 4/464; H03M 3/424

USPC .......................................... 341/155, 161, 163
See application file for complete search history.

(56) References Cited

U.S. PATENT DOCUMENTS

| | | | |
|---|---|---|---|
| 2005/0275577 A1* | 12/2005 | Bjornsen | H03M 3/46 341/155 |
| 2015/0138005 A1 | 5/2015 | Shiraishi et al. | |
| 2015/0256194 A1 | 9/2015 | Saito | |
| 2016/0043733 A1* | 2/2016 | Nezuka | H03M 3/464 341/143 |
| 2017/0077940 A1 | 3/2017 | Yoshioka et al. | |
| 2019/0089369 A1 | 3/2019 | Nezuka | |
| 2019/0215004 A1 | 7/2019 | Nezuka | |
| 2019/0363731 A1 | 11/2019 | Nezuka | |

OTHER PUBLICATIONS

Takato Katayama, Shiko Miyashita, Kazuki Sobue, Koichi Hamashita, "A 1.25MS/ s Two-Step Incremental ADC with 100dB DR and 110dB SFDR", 2018 Symposium on VLSI Circuits Digest of Technical Papers, p. 205-p. 206.

* cited by examiner

*Primary Examiner* — Peguy Jean Pierre
(74) *Attorney, Agent, or Firm* — Posz Law Group, PLC

(57) ABSTRACT

An analog-to-digital converter includes a primary converter and a secondary converter. The primary converter executes conversion processing to convert an analog input signal to a first digital signal through delta-sigma modulation. The secondary converter outputs a second digital signal by converting amplified analog output of a quantization error in the primary converter to the second digital signal.

7 Claims, 17 Drawing Sheets

FIG. 10
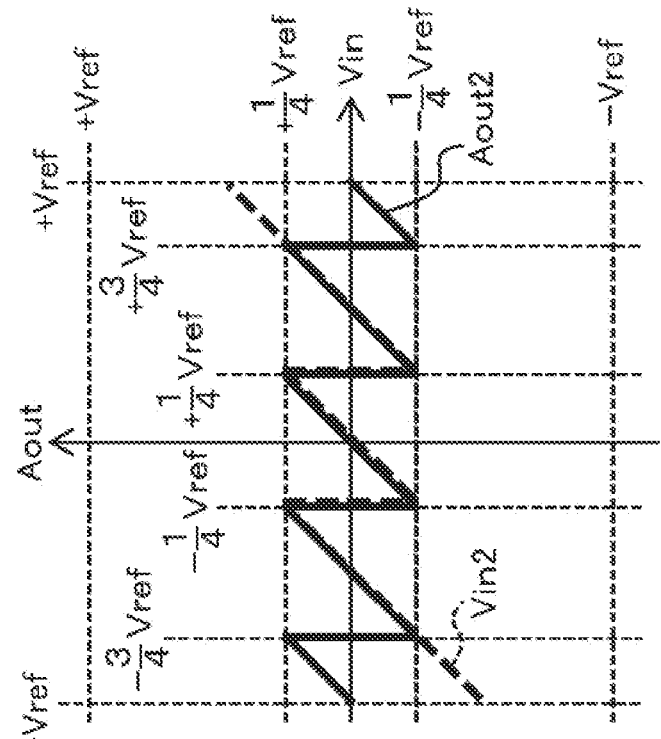
DAC CYCLE 1
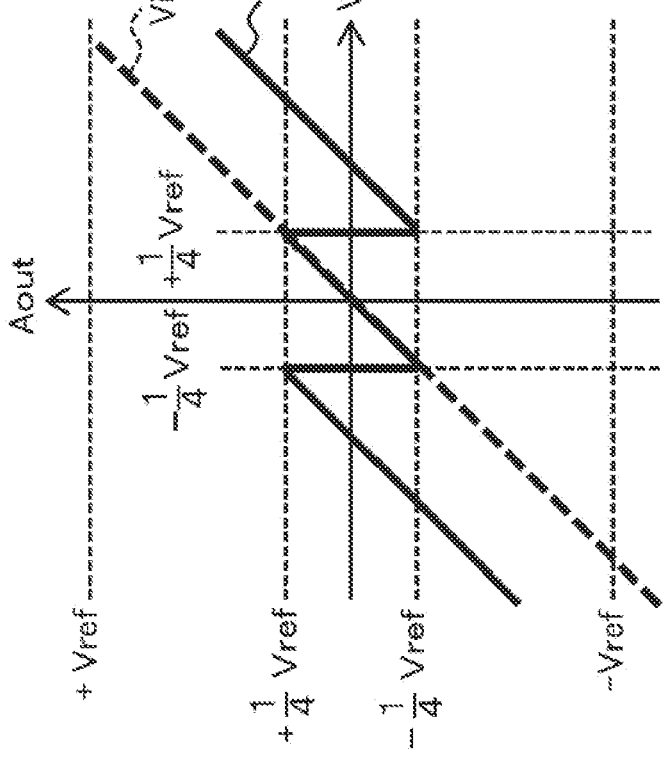
DAC CYCLE 2

US 12,063,053 B2

ANALOG-TO-DIGITAL CONVERTER

CROSS REFERENCE TO RELATED APPLICATIONS

The present application is a continuation application of International Patent Application No. PCT/JP2021/000695 filed on Jan. 12, 2021, which designated the U.S. and claims the benefit of priority from Japanese Patent Application No. 2020-016232 filed on Feb. 3, 2020. The entire disclosures of all of the above applications are incorporated herein by reference.

TECHNICAL FIELD

The present disclosure relates to an analog-to-digital (A/D) converter.

BACKGROUND

To accelerate processing executed by a delta-sigma analog-to-digital converter, for example, a hybrid structure combining a multibit delta-sigma analog-to-digital converter and a cyclic delta-sigma analog-to-digital converter may be adopted.

SUMMARY

The present disclosure describes an analog-to-digital converter including a primary converter and a secondary converter.

BRIEF DESCRIPTION OF DRAWINGS

Objects, features and advantages of the present disclosure will become more apparent from the following detailed description made with reference to the accompanying drawings. In the drawings:

FIG. 10 illustrates an operation explanatory diagram.

DETAILED DESCRIPTION

Figure 1:
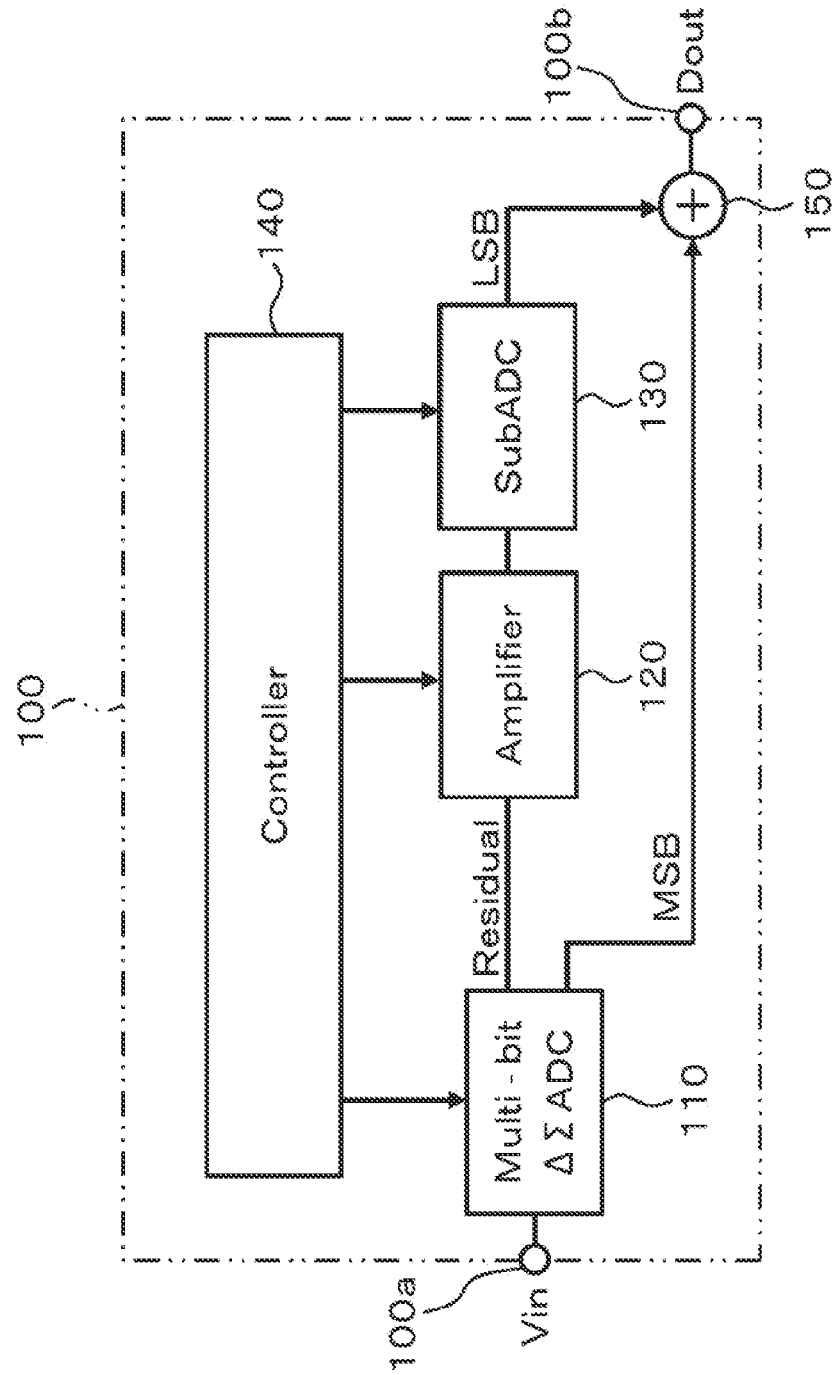
FIG. 1 is a block diagram of a structure adopted in one or more embodiments.

A delta-sigma analog-to-digital converter may include a hybrid structure having a multibit sigma-delta analog-to-digital converter and a cyclic delta-sigma analog-to-digital converter. The hybrid structure may enhance the speed of delta-sigma analog-to-digital conversion through multibit delta-sigma processing in the multibit sigma-delta analog-to-digital converter and further achieve high-speed processing with the cyclic delta-sigma analog-to-digital converter. However, as the number of partitioned levels of the multibit digital-to-analog converter increases, the demand for the precision of a comparator or a reference voltage in the cyclic analog-to-digital converter may become higher.

According to a first aspect of the present disclosure, an analog-to-digital converter includes a primary converter, an amplification circuit and a secondary converter. The primary converter having 2-bit or higher resolution executes conversion processing to convert an analog input signal to a first digital signal through delta-sigma processing. The amplification circuit executes amplification processing to amplify analog output of a quantization error in the primary converter and output the analog output that is amplified by the amplification circuit. The secondary converter outputs a second digital signal by converting the analog output that is amplified by the amplification circuit after the conversion processing executed by the primary converter to the second digital signal.

According to the above structure, the primary converter with 2-bit or higher resolution executes the delta-sigma modulation to convert the input analog voltage Vin to digital data and output the analog output of the quantization error to the amplification circuit. The amplification circuit amplifies the analog output of the quantization error to output the amplified analog output to the secondary converter. Since the secondary converter converts the analog output amplified by the amplification circuit to the digital data, it is possible to enhance analog-to-digital conversion without the need of adopting the high-performance secondary converter as the latter part of the above analog-to-digital converter.

According to a second aspect of the present disclosure, an analog-to-digital converter includes a primary converter and a secondary converter. The primary converter having 2-bit or higher resolution executes conversion processing to convert an analog input signal to a first digital signal through delta-sigma modulation, and executes amplification processing to amplify analog output of a quantization error and output the amplified analog output. The secondary converter outputs a second digital signal by converting the analog output of the quantization error to the second digital signal after the amplification processing and the conversion processing executed by the primary converter.

According to the above structure, the primary converter with 2-bit or higher resolution converts the input analog voltage Vin to the digital signal through the delta-sigma modulation, and then the primary converter amplifies the analog output of the quantization error to output the analog output. Since the secondary converter converts the amplified analog output provided from the primary converter to digital data, it is possible to enhance the analog-to-digital conversion without the need of adopting the high-performance secondary converter as the latter part of the above analog-to-digital converter.

The following describes a structure applied to the following one or more embodiments with reference to FIG. 1. FIG. 1 illustrates the structure of a hybrid analog-to-digital converter in which an analog-to-digital converter 100 includes a multibit delta-sigma main analog-to-digital converter (multi-bit ΔΣ ADC) 110, an amplifier (amp) 120, a sub analog-to-digital converter (sub ADC) 130, a control circuit (controller) 140 and an adder 150. The multibit delta-sigma main analog-to-digital converter 110 may also be referred to as a main analog-to-digital converter 110 in the following description. The amplifier described in the present disclosure may also be referred to as an amplification circuit.

In the above structure, the control circuit 140 controls switching operation for one or more internal switches based on a clock for the main analog-to-digital converter 110, the amplifier 120 and the sub analog-to-digital converter 130. The main analog-to-digital converter described in the present disclosure corresponds to a primary converter, and the sub analog-to-digital converter described in the present disclosure corresponds to a secondary converter.

The main analog-to-digital converter 110 receives an analog input voltage Vin provided from an input terminal 100a and executes multibit delta-sigma modulation to generate the digital converted output of a high-order bit as an output signal MSB, and outputs the output signal MSB to the adder 150. At this time, the main analog-to-digital converter 110 outputs analog output of a quantization error as Residual illustrated in FIG. 1. The residual corresponds to data of a low-order bit. The amplifier 120 amplifies the received analog output of the quantization error to output the amplified analog output of the quantization error to the sub analog-to-digital converter 130. The high-order bit described in the present disclosure may also be referred to as a most significant bit or one of most significant bits. The low-order bit described in the present disclosure may also be referred to as a least significant bit or one of least significant bits.

The sub analog-to-digital converter 130 adds the output signal MSB of the high-order bit provided from the main analog-to-digital converter 110 to the output signal LSB of the low-order bit provided from the sub analog-to-digital converter 130 for generating a digital converted value corresponding to the input signal Vin and outputting the digital converted value as a digital output Dout from an output terminal 100b. The output signal MSB of the high-order bit described in the present disclosure corresponds to a first digital signal, and the output signal LSB of the low-order bit described in the present disclosure corresponds to a second digital signal.

According to the above-mentioned structure applied to the following one or more embodiments, the main analog-to-digital converter 110 executes high-order bit analog-to-digital conversion processing for the input voltage Vin, and amplifies the converted analog output of the quantization error in the amplifier 120 to output the amplified analog output to the sub analog-to-digital converter 130. Therefore, it is possible to ease computing power demanded in low-order bit analog-to-digital conversion processing through the sub analog-to-digital converter 130. In other words, it is possible to enhance the precision of the conversion in the sub analog-to-digital converter 130 as compared with a structure without the amplifier 120.

First Embodiment

Figure 2:
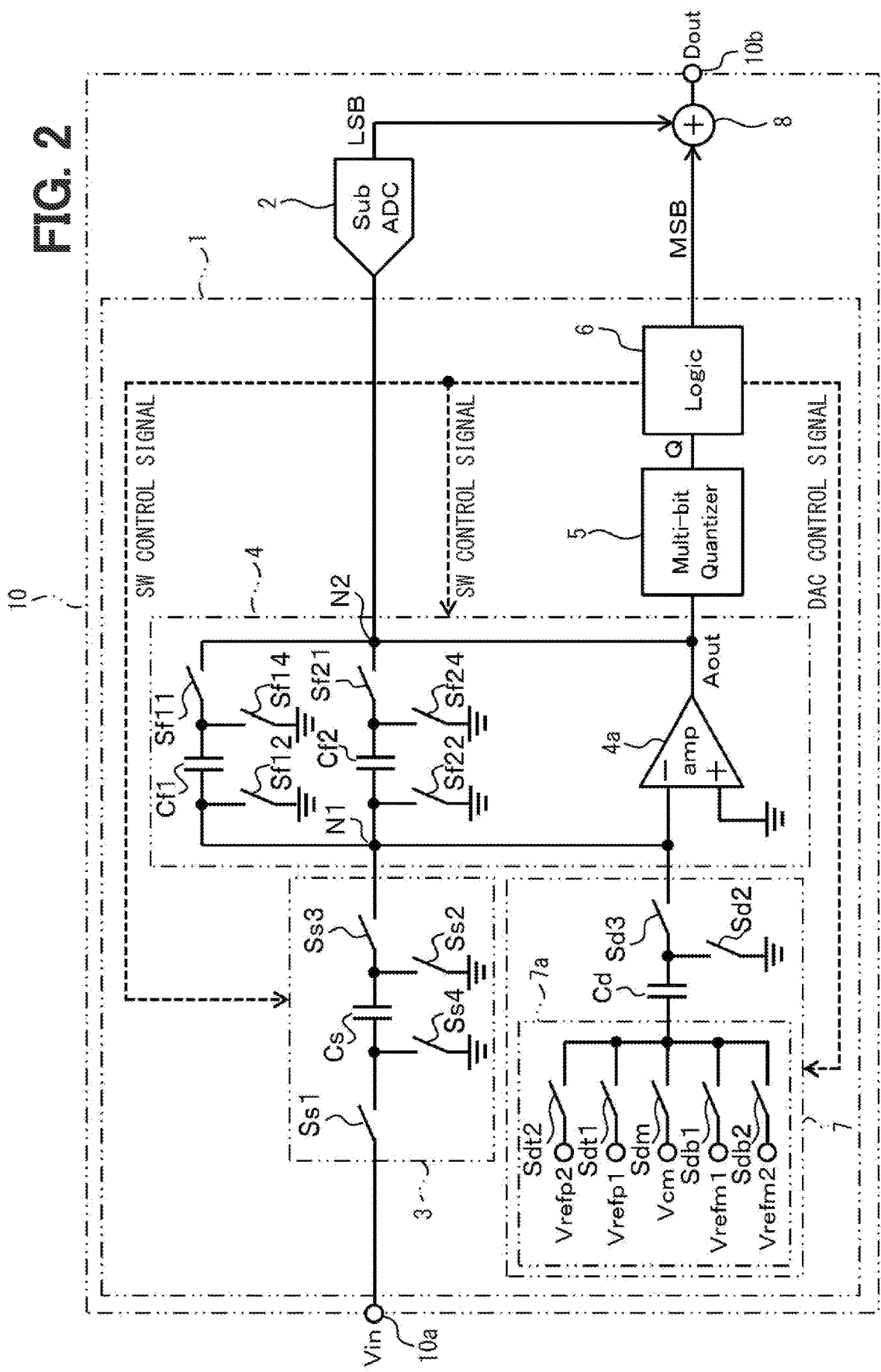
FIG. 2 illustrates an electrical structure according to a first embodiment.

The following describes a first embodiment with reference to FIGS. 2 to 6. In this embodiment, an analog-to-digital converter 10 is constructed by integrating the amplifier 120 into the main analog-to-digital converter 110 inside the structure described above. In FIG. 2, the analog-to-digital converter 10 is a hybrid analog-to-digital converter including a delta-sigma main analog-to-digital converter 1 and, for example, a cyclic sub analog-to-digital converter 2. In the following, the delta-sigma main analog-to-digital converter 1 is simply referred to as a main analog-to-digital converter 1 that corresponds to the primary converter, and the cyclic sub analog-to-digital converter 2 is simply referred to as a sub analog-to-digital converter (Sub ADC) 2 that corresponds to the secondary converter. However, the sub analog-to-digital converter 2 is not only limited to the cyclic type, but may also be one of other types. The analog-to-digital converter 10 includes an adder 8, and includes an input terminal 10a for an analog input voltage Vin and an output terminal 10b for a digital signal output Dout. The main analog-to-digital converter 1 includes, for example, a sampler 3, an integration circuit 4, a quantizer (Multi-bit Quantizer) 5, a logic circuit (Logic) 6, and a digital-to-analog converter 7.

The sampler 3 includes a sampling capacitor Cs and four switches Ss1 to Ss4. The input terminal 10a is connected to the integration circuit 4 through the switch Ss1, the sampling capacitor Cs, and the switch Ss3 that are connected in series. An input side of the sampling capacitor Cs is connected to an analog ground as a reference potential through a switch Ss4. An output side of the sampling capacitor Cs is connected to an analog ground as the reference potential through the switch Ss2. The logic circuit 6 controls the switching operation for turning on or off the four switches Ss1 to Ss4. The analog ground is not limited to 0 V, and may be a predetermined potential set as the reference potential.

The logic circuit 6 controls the operation of the switches Ss1 to Ss4 in the sampler 3 to execute sample processing and hold processing. The logic circuit 6 turns on the switches Ss1 and Ss2 and turns off the switches Ss3 and Ss4 in the sample processing executed by the sampler 3. The logic circuit 6 turns off the switches Ss1 and Ss2 and turns on the switches Ss3 and Ss4 in the hold processing.

The integration circuit 4 includes an amplifier 4a, integration capacitors Cf1, Cf2, and switches Sf11, Sf12, Sf14, Sf21, Sf22, Sf24. The amplifier 4a has an inverting input terminal connected to the switch Ss3 in the sampler 3 through a node N1, and has a non-inverting input terminal connected to the analog ground. The output terminal of the amplifier 4a is connected to the node N2 and the quantizer 5. The amplifier 4a outputs, as analog output Aout, a result of integration processing performed in accordance with an input transferred from the sampler 3 and the digital-to-analog converter 7.

The integration capacitor Cf1 has a terminal connected to the node N1 and connected to the analog ground through the switch Sf12, and has the other terminal connected to the node N2 through the switch sf11 and connected to the analog ground through the switch Sf14. The integration capacitor Cf2 has a terminal connected to the node N1 and connected to the analog ground through the switch Sf22, and has the other terminal connected to the node N2 through the switch sf21 and connected to the analog ground through the switch Sf24. In the embodiment, the integration capacitors Cf1 and Cf2 are provided to have the same capacitance. However, the integration capacitors Cf1 and Cf2 may also have different capacitances.

Figure 3:
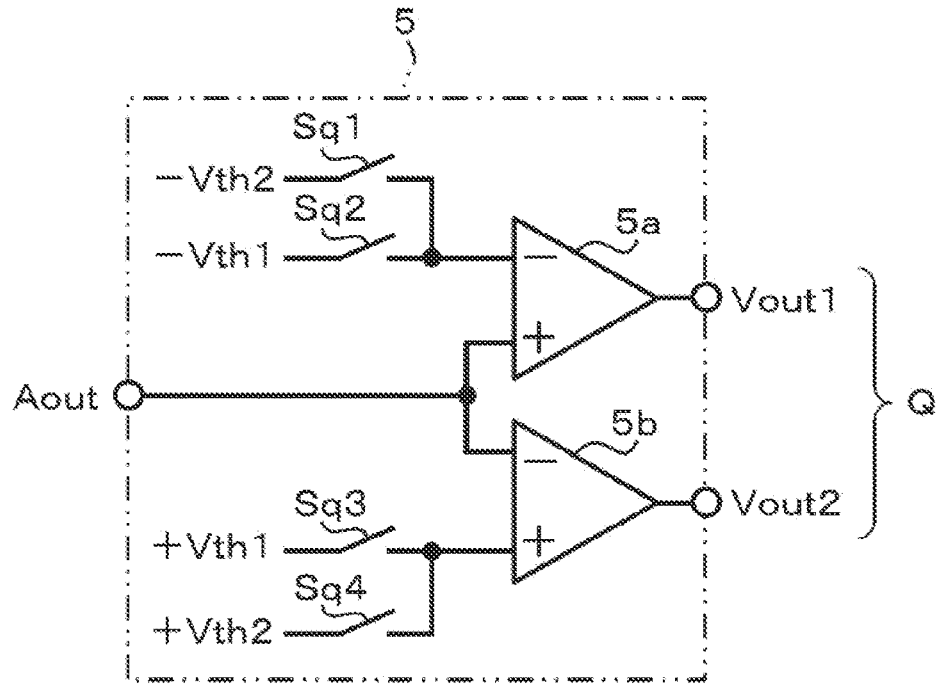
FIG. 3 illustrates an electrical structure of a quantizer.

The quantizer 5 executes multibit processing, and includes two comparators 5a, 5b as illustrated in FIG. 3. The comparator 5a receives a threshold voltage −Vth2 at an inverting input terminal through a switch Sq1, and receives a threshold voltage −Vth1 through a switch Sq2. The comparator 5b receives a threshold voltage +Vth1 at a non-inverting input terminal through a switch Sq3, and receives a threshold voltage +Vth2 through a switch Sq4. The non-inverting input terminal of the comparator 5a and the inverting input terminal of the comparator 5b receive the analog output Aout from the integration circuit 4.

The comparator $5a$ compares the analog output Aout with the threshold voltage −Vth1 or −Vth2 through the switching of the switches Sq1, Sq2, and outputs the output signal Vout1 at a high level based on a condition that the analog output Aout has a higher level than the threshold voltage −Vth1 or −Vth2. The comparator $5b$ compares the analog output Aout with the threshold voltage +Vth1 or +Vth2 through the switching of the switches Sq3, Sq4, and outputs the output signal Vout2 at a high level based on a condition that the analog output Aout has a lower level than the threshold voltage +Vth1 or +Vth2. A signal having the combination of the output signals Vout1 and Vout2 is output as a quantized signal Q.

The threshold voltages −Vth2, −Vth1, +Vth1 and +Vth2 provided to the two comparators $5a$ and $5b$ are set based on the following relationship. As the analog ground is set as the reference potential, +Vth2 and +Vth1 are positive threshold voltages, and the threshold voltage +Vth2 is set to a value larger than the value of the threshold voltage +Vth1. In other words, a relation of +Vth2>+Vth1>0 is satisfied. As the analog ground is set as the reference potential, −Vth1 and −Vth2 are negative threshold voltages, and the threshold voltage −Vth2 is set to a value smaller than the value of the threshold voltage −Vth1. In other words, a relation of −Vth2<−Vth1<0 is satisfied.

More specifically, each of the threshold voltages is set as follows with respect to the reference voltage Vref set with the analog ground as the reference potential.

$-Vth2=-(3/4)\times Vref$ $-Vth1=-(1/4)\times Vref$ $+Vth1=+(1/4)\times Vref$ $+Vth2=+(3/4)\times Vref$ When the quantizer 5 receives the analog output Aout from the integration circuit 4, the quantizer 5 compares the analog output Aout with the above four threshold voltages, and outputs the comparison results Vout1 and Vout2 as the quantization output Q with multiple bits to the logic circuit 6.

Figure 4:
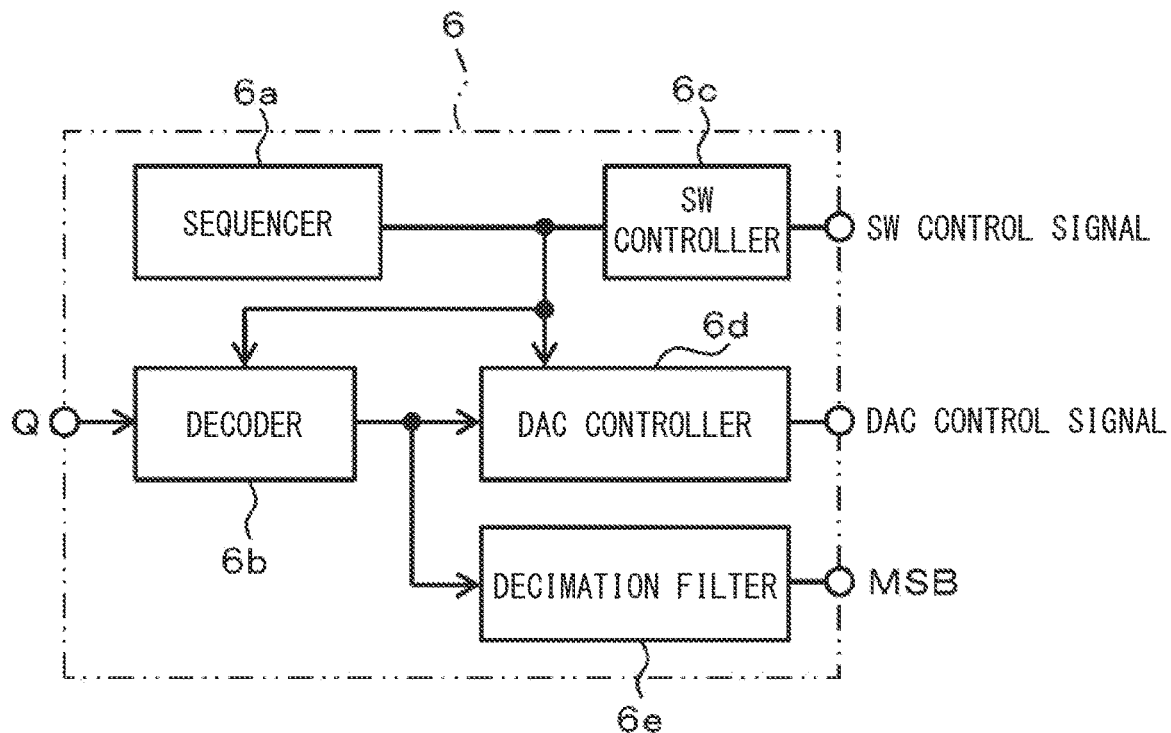
FIG. 4 illustrates a block diagram of a logic circuit.

As illustrated in FIG. 4, the logic circuit 6 includes a sequencer $6a$, a decoder $6b$, a switch (SW) controller $6c$, a digital-to-analog converter (DAC) controller $6d$ and a decimation filter $6e$ inside the logic circuit 6. The sequencer $6a$ outputs a control signal to the decoder $6b$, the SE controller $6c$ and the DAC controller $6d$ according to a preset processing procedure.

The output signals Vout1, Vout2 provided as the quantization result Q are decoded by the decoder $6b$, and then the result in which the output signal MSB of the high-order bit is generated in the decimation filter $6e$ is output to the adder 8. The logic circuit 6 generates a DAC control signal through the DAC controller $6d$ according to the input quantization result Q and outputs the DAC control signal to the digital-to-analog converter 7. In the logic circuit 6, the SW controller $6c$ outputs a SW control signal for controlling the switches in the sampler 3 and the switches in the integration circuit 4 based on a sequence signal provided from the sequencer $6a$.

The digital-to-analog converter 7 includes a DAC unit $7a$ for providing the analog potential, a DAC capacitor Cd and seven switches Sdt2, Sdt1, Sdm, Sdb1, Sdb2, Sd1, Sd3 for controlling the DAC unit $7a$ and the DAC capacitor Cd. The DAC unit $7a$ corresponds to a digital-to-analog converting circuit. The DAC unit $7a$ sets five analog potentials Vrefp2, Vrefp1, Vcm, Vrefm1 and Vrefm2 as reference potentials through a potential generator (not shown). The reference potential Vcm is set as the analog ground being a standard potential or a common potential, the reference potentials Vrefp1, Vrefp2 are set to be higher than the analog ground, and the reference potentials Vrefm2, Vrefm1 are set to be lower than the analog ground.

When the reference potential Vcm1 is 0 V, the Vrefp and Vrefm are set to satisfy a relation of Vrefp=−Vrefm, that is, absolute values are equal and polarities are opposite to each other. Similarly, when the reference potential Vcm is 0 V, the Vrefp2 and Vrefm2 are set to satisfy a relation of Vrefp=−Vrefm, that is, absolute values are equal and polarities are opposite to each other.

The switches Sdt2, Sdt1, Sdm, Sdb1 and Sdb2 respectively function as selection switches, and respectively connect the Vrefp2, Vrefp1, Vcm1, Vrefm1, and Vrefm2 to an input side of the DAC capacitor Cd. An output side of the DAC capacitor Cd is connected to the analog ground through the switch Sd2, and is connected to the inverting input terminal of the amplifier $4a$ of the integration circuit 4 through the switch Sd3. Each of the above-mentioned five switches Sdt2, Sdt1, Sdm, Sdb1, Sdb2 is turned on or off through the DAC control signal provided by the logic circuit 6.

In this case, the logic circuit 6 performs the sample processing and the hold processing based on the control signal corresponding to the quantization result Q output from the quantizer 5. The quantization result Q may also be referred to as a quantized signal Q. In the sample processing, the logic circuit 6 turns on the switch Sd2 and turns on any one of the selection switches Sdt2, Sdt1, Sdm, Sdb1, Sdb2. In the hold processing, the logic circuit 6 turns off the switch Sd2 and turns on the switch Sd3, and turns on any one of the switches Sdt2, Sdt1 Sdm, Sdb1, Sdb2.

The analog potentials Vref2, Vref1, Vcm, Vrefm1, Vrefm2 set by the digital-to-analog converter 7 are set, for example, as follows with respect to the reference voltage Vref.

$Vrefp2=+Vref$ $Vrefp1=+(1/2)\times Vref$ $Vcm=0$ $Vrefm1=-(1/2)\times Vref$ $Vrefm2=-Vref$ The sub analog-to-digital converter 2 receives the analog output Aout present at the node N2 processed by the main analog-to-digital converter 1, and converts the analog output Aout to a digital value to output the digital value. The sub analog-to-digital converter 2 executes analog-to-digital conversion processing from the analog output Aout amplified by the integration circuit 4 to generate the output signal LSB of the low-order bit and output the output signal LSB to the adder 8, when the conversion processing through the main analog-to-digital converter 1 is completed.

The adder 8 adds the output signal MSB of the high-order bit provided from the main analog-to-digital converter 110 to the output signal LSB of the low-order bit provided from the sub analog-to-digital converter 2 for generating a digital converted value corresponding to the input signal Vin and outputting the digital converted value as a digital output Dout from an output terminal $10b$.

Figure 5:
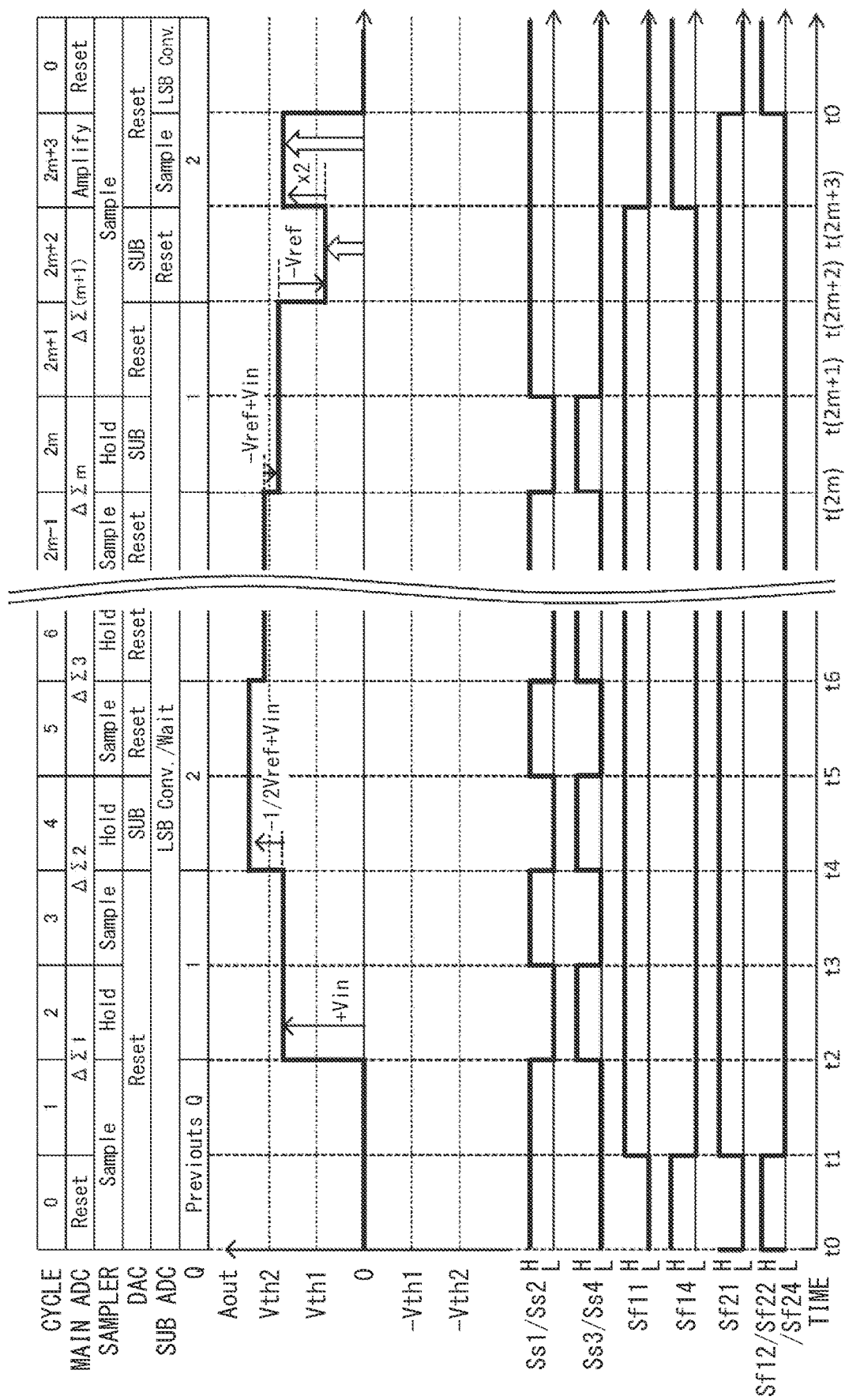
FIG. 5 illustrates a timing chart.
Figure 6:
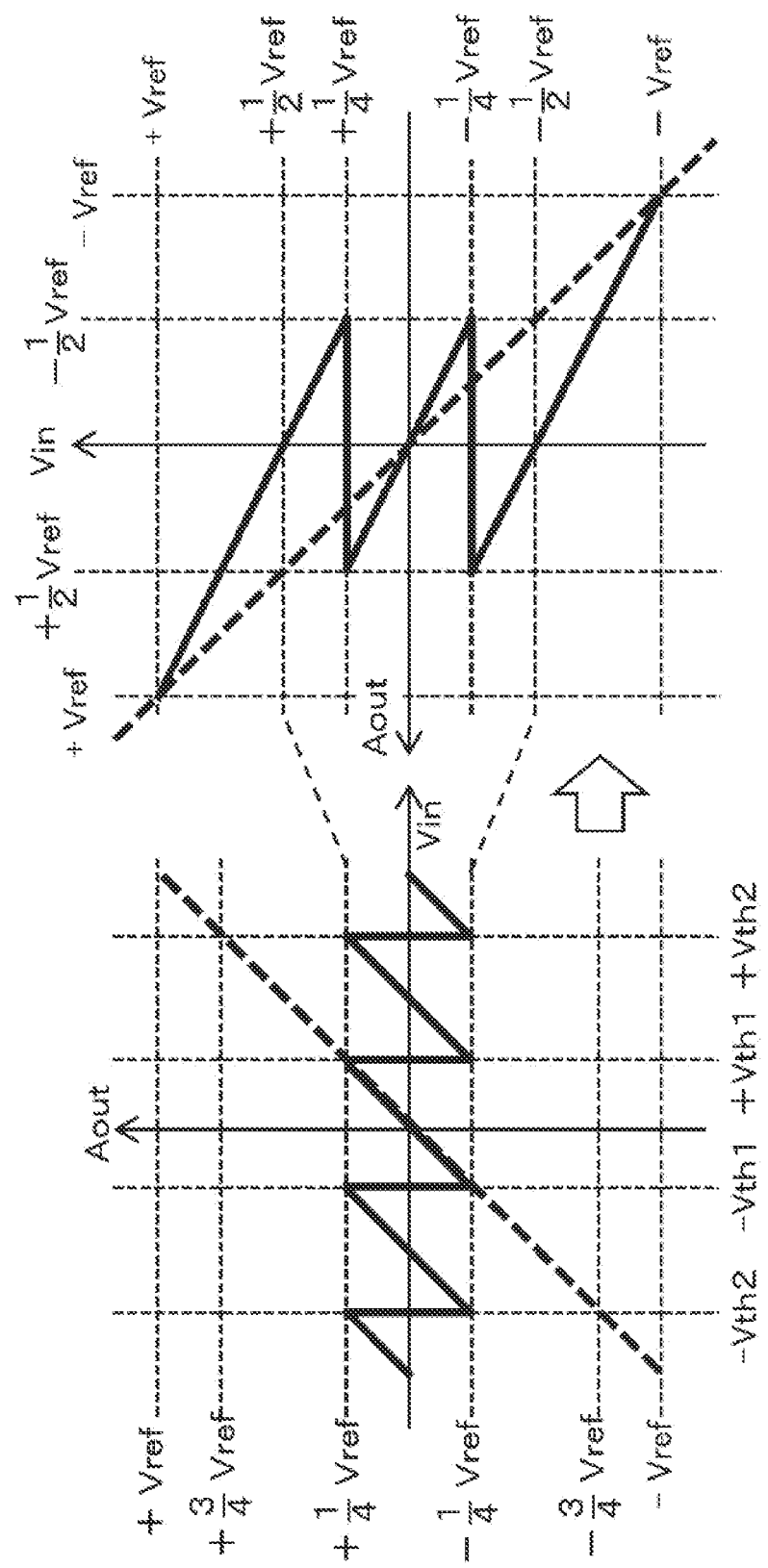
FIG. 6 illustrates an operation explanatory diagram.

The following describes an operation of the above-described configuration with reference to FIGS. 5, 6. In the timing chart illustrated in FIG. 5, an operating state of each of switches is indicated by a high level "H", and an off state is indicated by a low level "L". Further, the clock cycles are indicated as 0, 1, . . . , 2 m−1, 2 m, and the like, and the clock change timings are indicated as times t0, t1, . . . , t(2 m), t(2 m+1), and the like.

In the timing chart illustrated in FIG. 5, the sample processing is labeled as "Sample"; the hold processing is labelled as "Hold"; the reset processing is labelled as "Reset"; the wait condition is labelled as "Wait"; subtraction processing is labelled as "SUB"; previous output Q is labelled as "Previouts Q". These labels are also applied to FIGS. 12 and 14 described hereinafter.

Each of the main analog-to-digital converter 1 and the sub analog-to-digital converter 2 executes a single phase, that is, delta-sigma modulation (ΔΣ modulation) once in two cycles. The main analog-to-digital converter 1 executes the delta-sigma modulation through m-phases as the processing period from cycle 1 in the phase ΔΣ1 to cycle 2 m in the phase ΔΣm. The sub analog-to-digital converter 2 is in the wait condition during the delta-sigma modulation period through m-phases until the cycle 2 m of the phase ΔΣm in the main analog-to-digital converter 1 and the amplification processing period from the cycle (2 m+1) to the cycle (2 m+2) in the phase ΔΣ(m+1), and executes low-bit analog-to-digital conversion in an arbitrary period. The delta-sigma modulation described in the present disclosure may also be referred to delta-sigma processing.

First, during the period of reset cycle 0 at the start of operation, the main analog-to-digital converter 1 turns off the switches Sf11, Sf21 in the integration circuit 4 and turns on the switches Sf12, Sf14, Sf22, Sf24 in the integration circuit 4 to execute the reset operation for discharging the integration capacitors Cf1, Cf2. In the sampler 3, during the period of the cycle 0 and the cycle 1, the switches Ss1, Ss2 are turned on and the switches Ss3, Ss4 are turned off to connect the input terminal 10a to the sampling capacitor Cs for executing the sample processing for the input signal Vin.

In the cycles 1 and 2 of the subsequent phase ΔΣ1, the delta-sigma modulation is executed and the sample processing executed by the sampler 3 as described above is continued in the main analog-to-digital converter 1. In the latter cycle(2, the switches Ss1, Ss2 are turned off and the switches Ss3, Ss4 are turned on in the sampler 3 to transfer the charge of the sampling capacitor Cs to the integration circuit 4 from the node N1. As a result, in the integration circuit 4, the analog output Aout has output corresponding to the input voltage Vin, and first quantization processing is executed in the quantizer 5.

At this time, the analog output Aout is determined based on five levels by switching the switches Sq1, Sq2, Sq3, Sq4 according to the four threshold voltages +Vth2, +Vth1, −Vth1, −Vth2, and the determination results Vout1, Vout2 are output as the quantized signal Q to the logic circuit 6.

In the logic circuit 6, decode processing is executed based on the quantized signal Q of Vout1, Vout2 provided from the quantizer 5, the DAC control signal corresponding to the result is output to the digital-to-analog converter 7 to execute the switching control of switches, and the SW control signal is output to the sampler 3 and the integration circuit 4 to execute switching control of the switches.

As a result, in the main analog-to-digital converter 1, in the second delta-sigma modulation and the subsequent delta-sigma modulation, the analog voltage output from the digital-to-analog converter 7 selected according to the value of the quantized signal Q of the quantizer 5 is applied as the difference with respect to the sample signal, and the analog output Aout of the integration circuit 4 is repeated to execute the quantization processing through the quantizer 5.

The analog output Aout at this time, as illustrated at the left side of FIG. 6, the input voltage Vin is quantized by four threshold voltages, and the quantization error remained between −¼Vref and +¼Vref is further quantized in the subsequent delta-sigma modulation. The input voltage Vin at the horizontal axis at the left side of the FIG. 6 indicates Aout before the execution of the hold processing through the digital-to-analog converter 7, and Aout indicated at the vertical axis indicates Aout after the execution of the hold processing. The above description is also applied to the input voltage Vin indicated at the vertical axis and the output Aout indicated at the horizontal axis in the right side of FIG. 6.

When the main analog-to-digital converter 1 executes the delta-sigma processing until the phase ΔΣm at the cycle 2 m, the output signal MSB of the predetermined high-order bit is output to the adder 8 from the logic circuit 6.

After that, in the main analog-to-digital converter 1, when the output of the digital-to-analog converter 7 is transferred to the integration circuit 4 from the cycle (2 m+1) to the cycle (2 m+2) in the phase ΔΣ(m+1), the analog output Aout as the quantization error is output to the node N2. As a result, in the subsequent phase ΔΣ(m+2), when the switch Sf11 for switching the connection state of the integration capacitors Cf1, Cf2 is turned off and the switch Sf14 is turned on, the analog output Aout is amplified by a factor of 2.

As a result, as indicated at the right side of FIG. 6, the analog output Aout of the quantization error in the "m-th" delta-sigma modulation as the input signal provided to the sub analog-to-digital converter 2 is amplified by a factor of 2. After that, in the sub analog-to-digital converter 2, the analog-to-digital conversion processing is executed based on the input analog output Aout to generate the output LSB of the predetermined low-order bit, and the output LSB is sent to the adder 8.

The adder 8 adds the output signal MSB of the high-order bit provided from the main analog-to-digital converter 1 to the output signal LSB of the low-order bit provided from the sub analog-to-digital converter 2 to output digital output Dout to the output terminal 10b.

According to the first embodiment, the main analog-to-digital converter 1 executes high-order bit analog-to-digital conversion for the input voltage Vin, and amplifies the converted analog output of the quantization error to output the amplified analog output to the sub analog-to-digital converter 2. Therefore, it is possible to ease computing power demanded in low-order bit analog-to-digital conversion through the sub analog-to-digital converter 2.

Second Embodiment

Figure 7:
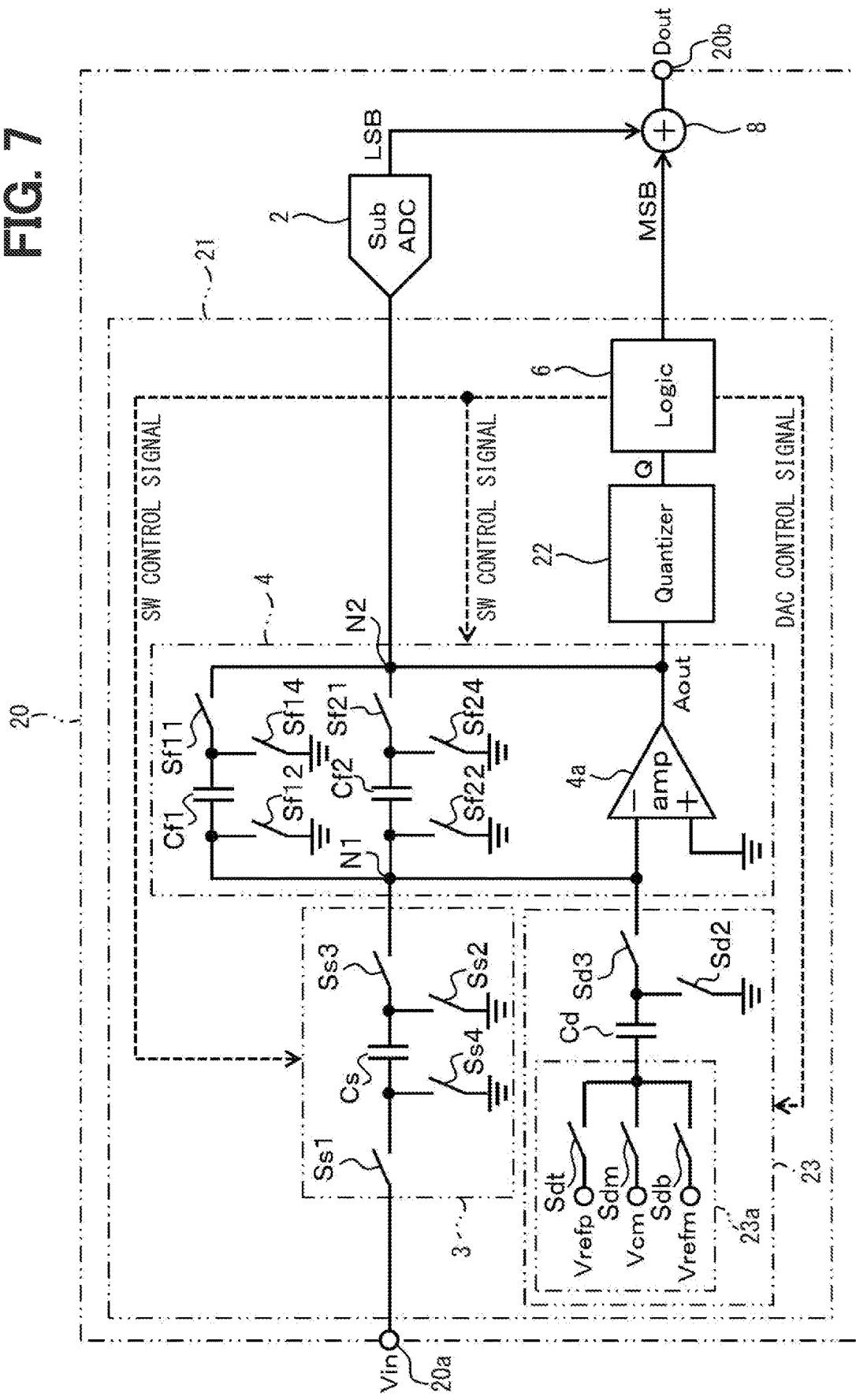
FIG. 7 illustrates an electrical structure according to a second embodiment.

The following describes a second embodiment with reference to FIGS. 7 to 10, and describes the parts different from those of the first embodiment. In the present embodiment, as illustrated in FIG. 7, in an analog-to-digital converter 20, a 1.5-bit quantizer 22 is adopted as a main analog-to-digital converter, and a digital-to-analog converter 23 has an analog potential with three levels. On the other hand, in one-time sampling processing, multibit output is acquired by multi-rate processing executed multiple times by the quantizer 22. The quantizer 22 may be a 1-bit device.

Figure 8:
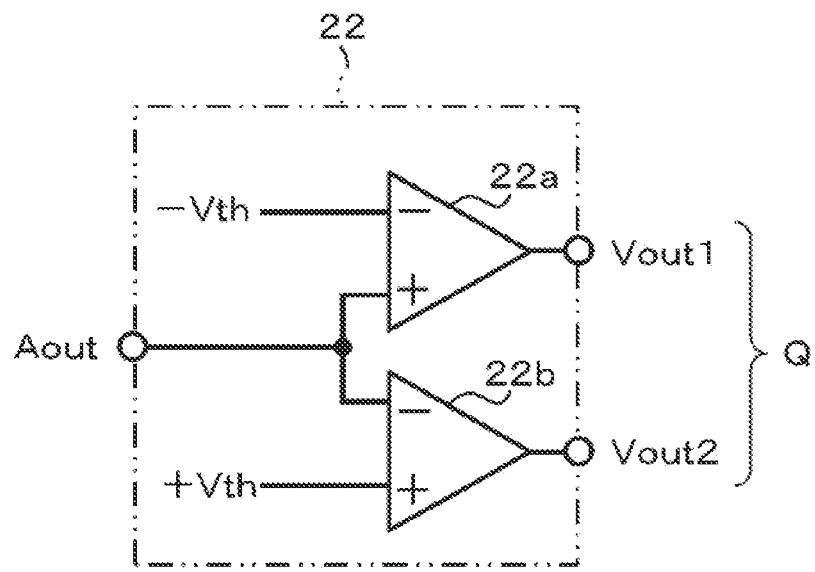
FIG. 8 illustrates an electrical structure of a quantizer.

The quantizer 22 includes two comparators 22a, 22b as illustrated in FIG. 8. The comparator 22a receives the threshold voltage −Vth at an inverting input terminal. The comparator 22b receives the threshold voltage +Vth at a non-inverting input terminal. The non-inverting input terminal of the comparator 22a and the inverting input terminal of the comparator 22b receives the analog output Aout of the integration circuit 4.

The comparator 22a compares the analog output Aout with the threshold voltage −Vth1, and outputs the output signal Vout1 at a high level based on a condition that the analog output Aout has a higher level than the threshold voltage −Vth1. The comparator 22b compares the analog output Aout with the threshold voltage +Vth1, and outputs the output signal Vout2 at a high level based on a condition that the analog output Aout has a higher level than the threshold voltage +Vth1. A signal having the combination of the output signals Vout1 and Vout2 is output as a quantized signal Q.

For example, the threshold voltages −Vth, +Vth provided to the comparators 22a, 22b are respectively set to be identical to the threshold voltages −Vth1, +Vth1 described in the first embodiment. More specifically, each of the threshold voltages is set as follows with respect to the reference voltage Vref.

$$-Vth=-(1/4) \times Vref$$

$$+Vth2=+(1/4) \times Vref$$

When the quantizer 22 receives the analog output Aout from the integration circuit 4, the quantizer 5 compares the analog output Aout with the above threshold voltages, and outputs the comparison results Vout1 and Vout2 as the quantization output Q to the logic circuit 6.

The digital-to-analog converter 23 includes a DAC unit 23a for providing the analog potential, a DAC capacitor Cd and five switches Sdt, Sdm, Sdb, Sd2, Sd3 for controlling the DAC unit 23a and the DAC capacitor Cd. The DAC unit 23a corresponds to a digital-to-analog converting circuit. The DAC unit 23a sets three analog potentials Vrefp, Vcm, and Vrefm as reference potentials through a potential generator (not shown). The reference potential Vcm is set as the analog ground being the standard potential, the reference potentials Vrefp is set to be higher than the analog ground, and the reference potentials Vrefm is set to be lower than the analog ground.

When the reference potential Vcm is 0 V, the Vrefp and Vrefm are set to satisfy a relation of Vrefp=−Vrefm, that is, absolute values are equal and polarities are opposite to each other. The switches Sdt, Sdm and Sdb function as selection switches, and connect Vrefp, Vcm and Vrefm to inputs of the DAC capacitor Cd. Each of the above-mentioned three switches Sdt, Sdm, Sdb is turned on or off through the DAC control signal provided by the logic circuit 6.

Figure 9:
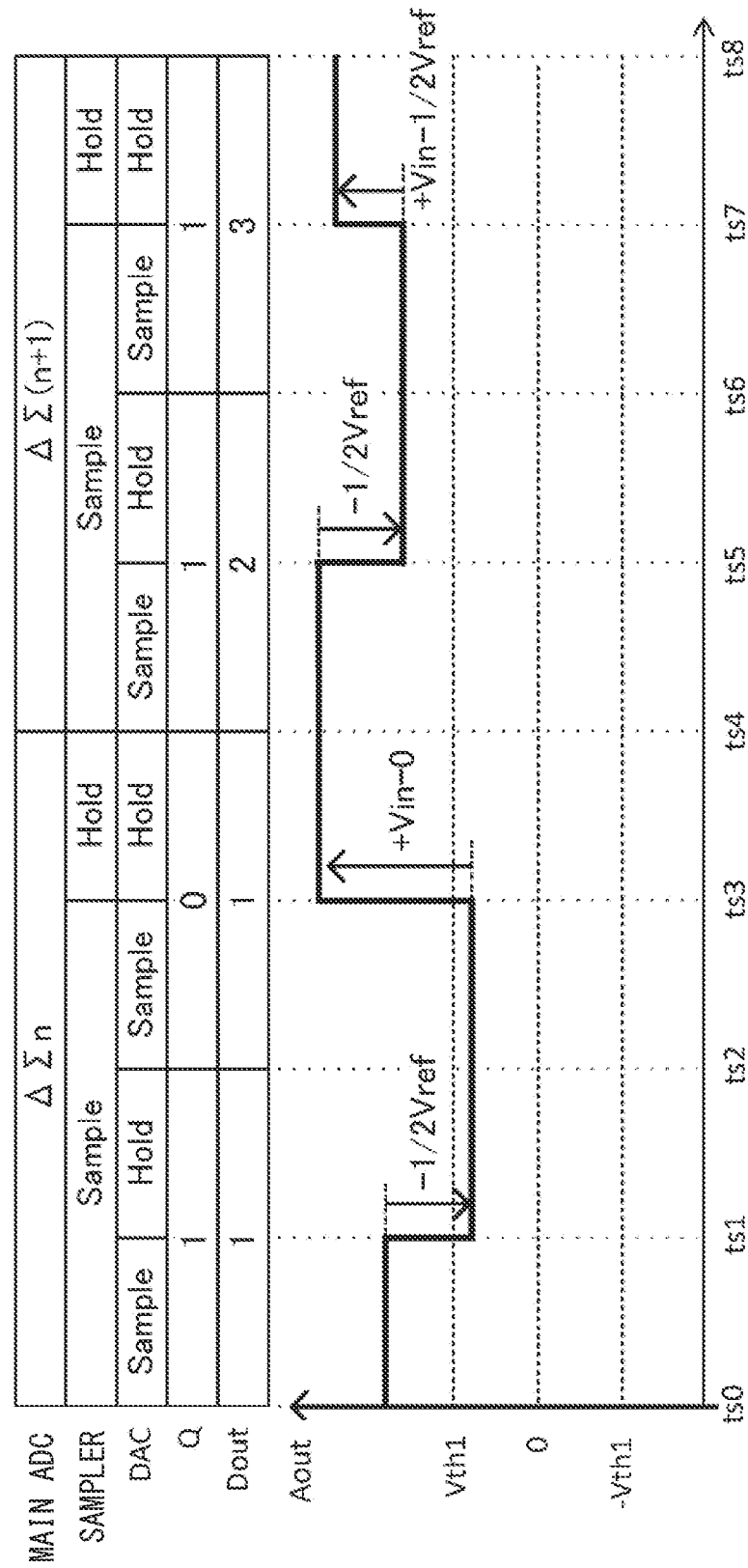
FIG. 9 illustrates a timing chart.

The following describes an operation of the above-described configuration with reference to FIGS. 9, 10. In the timing chart illustrated in FIG. 9, the parts different from the parts in the first embodiment are excerpted and shown. In this embodiment, the cycle frequency used as the clock is doubled with respect to the frequency shown in the first embodiment, and the delta-sigma modulation in a single phase in the main analog-to-digital converter 21 is set to four cycles, and the multibit processing is executed by controlling the digital-to-analog converter 23 to execute the quantization processing twice and the digital-to-analog conversion processing. The single phase described in the present disclosure may also be referred to as a single processing phase.

In this situation, as illustrated in FIG. 9, in the main analog-to-digital converter 21, the sample processing through the sampler 3 is executed three times and the hold operation is executed in one cycle in a single phase of the delta-sigma processing executed by the main analog-to-digital converter 21. In the present embodiment, since the time through two cycles corresponds to the time through one cycle in the first embodiment, the time of the sample processing is set to a time that is 1.5 times longer than the time of the sample processing in the first embodiment.

In each of n-phases from the phase ΔΣ1 to the phase ΔΣn of the main analog-to-digital converter 21, the digital-to-analog converter 23 executes the sample processing twice and the hold processing twice to perform the multi-rate processing. As illustrated in DAC Cycle 1 of FIG. 10, in the first-time sample processing and the first-time hold processing, the quantizer 22 acquires the output with three levels as the first-time quantization output Q. As illustrated in DAC Cycle 2 of FIG. 10, in the second-time sample processing and the second-time hold processing, the quantizer 22 acquires the output with five levels as the second-time quantization output Q2. As a result, it is possible to acquire the quantization output Q similar to the one in the multi-rate processing in the first embodiment.

In the phase ΔΣ(n+1) of the main analog-to-digital converter 21, the analog output Aout corresponding to the quantization error is amplified by a factor of 2, and is output to the node N2. As a result, the sub analog-to-digital converter 2 receives the input of the amplified analog output Aout to output the amplified analog output Aout with the execution of the low-order bit conversion processing.

Even in the second embodiment, it is possible to attain the advantageous effect similar to the one in the first embodiment by executing the multi-rate processing by the quantizer 22 and the digital-to-analog converter 23 in the main analog-to-digital converter 21.

In this embodiment, the main analog-to-digital converter 21 assigns the processing with four cycles to a single phase of the delta-sigma processing executed in the same time as in the first embodiment, and the quantizer 22 and the digital-to-analog converter 23 executes the multi-rate processing by executing the sample processing twice and the hold operation processing. As a result, in the sampler 3 of the main analog-to-digital converter 21, it is possible to execute the sample processing with three cycles, and it is possible to ensure the sampling time for the input voltage Vin to be substantially 1.5 times longer than the sampling time in the first embodiment.

Third Embodiment

Figure 11:
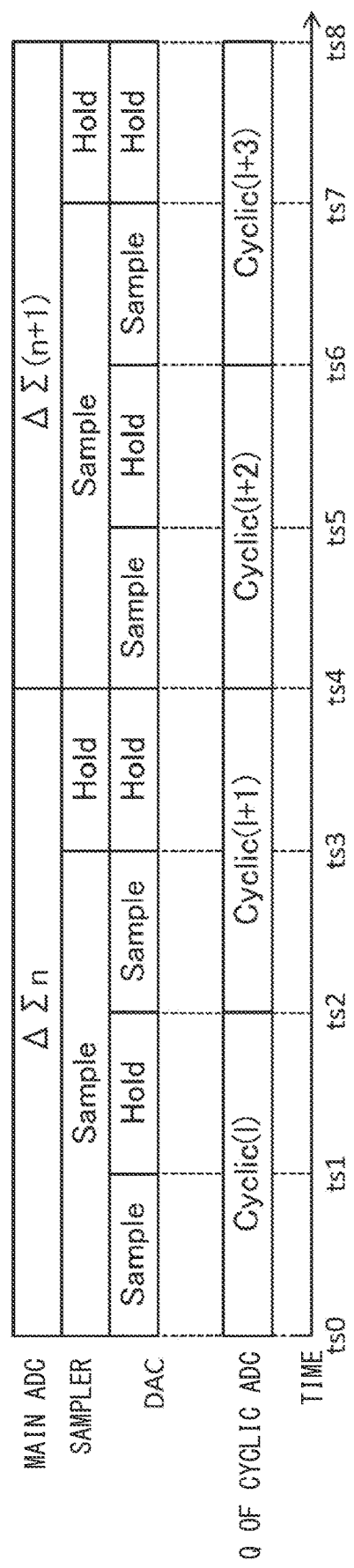
FIG. 11 illustrates a timing chart according to a third embodiment.

The following describes a third embodiment with reference to FIG. 11, and describes the parts different from those of the second embodiment. In this embodiment, as illustrated in the comparative diagram of FIG. 11, cyclic processing executed four times respectively as Cyclic (I) to Cyclic (I+3) of a cyclic analog-to-digital converter provided as the sub analog-to-digital converter 2 corresponds to two-time phase processing in the main analog-to-digital converter 21.

Accordingly, the sub analog-to-digital converter 2 executes two phase processing in a single phase of the main analog-to-digital converter 21. The execution of the main analog-to-digital converter 21 shown in FIG. 11 and the execution of the sub analog-to-digital converter 2 as the cyclic analog-to-digital converter indicate the time allocation, but do not indicate timing.

As a result, in the sub analog-to-digital converter 2, the processing speed is increased by executing the sample processing twice and the hold processing twice in response to a single phase of the operation in the main analog-to-digital converter 21.

Fourth Embodiment

Figure 12:
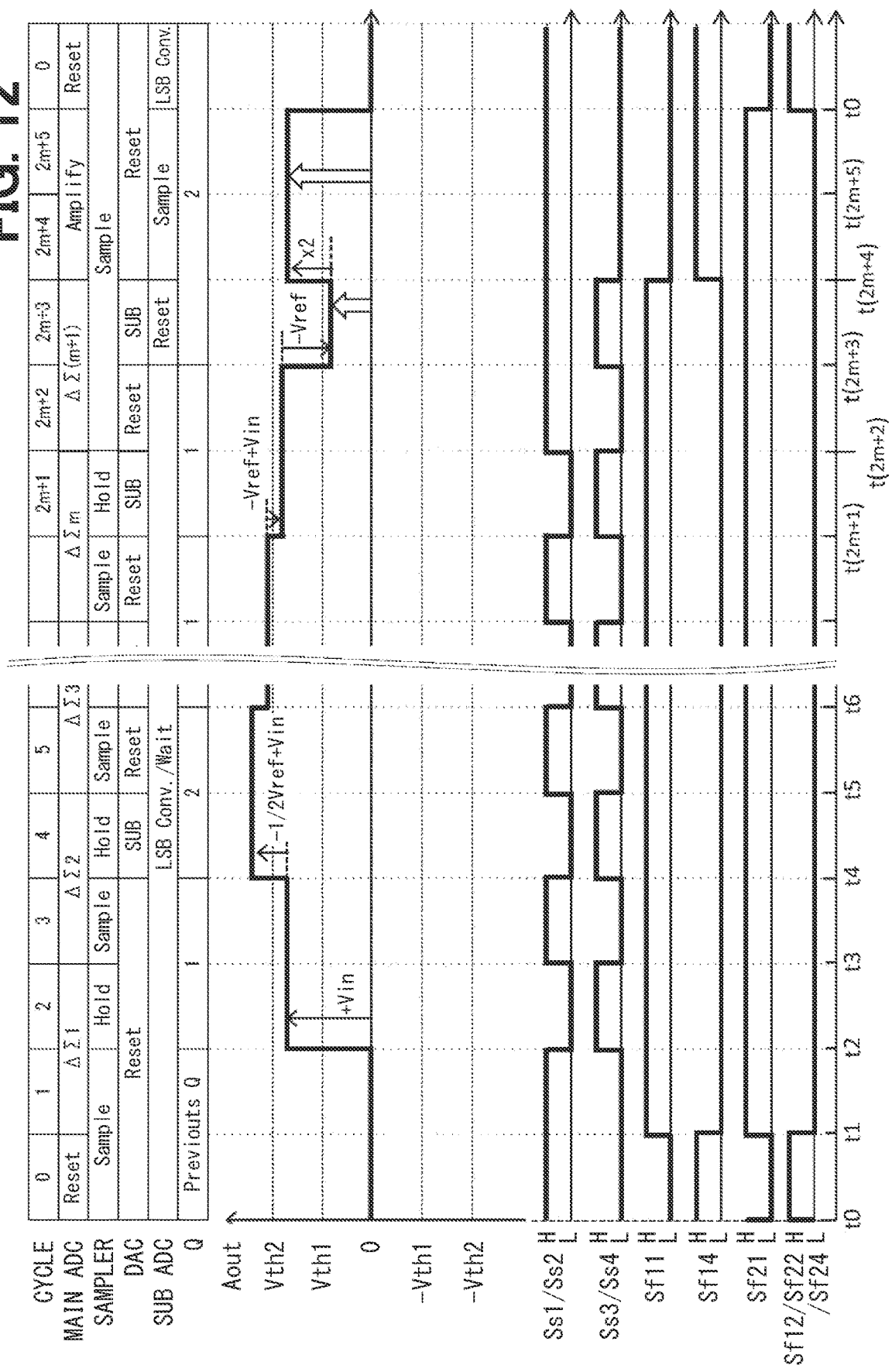
FIG. 12 illustrates a timing chart according to a fourth embodiment.

The following describes a fourth embodiment with reference to FIG. 12, and describes the parts different from those of the first embodiment. In this embodiment, as illustrated in FIG. 12, the amplification cycle of the main analog-to-digital converter 1 is increased and two cycles are allocated.

As a result, it is possible to ease the power of the amplifier 4a in the main analog-to-digital converter 1, and it is possible to acquire the amplified output with enhanced precision without using a high-performance amplifier.

Fifth Embodiment

Figure 13:
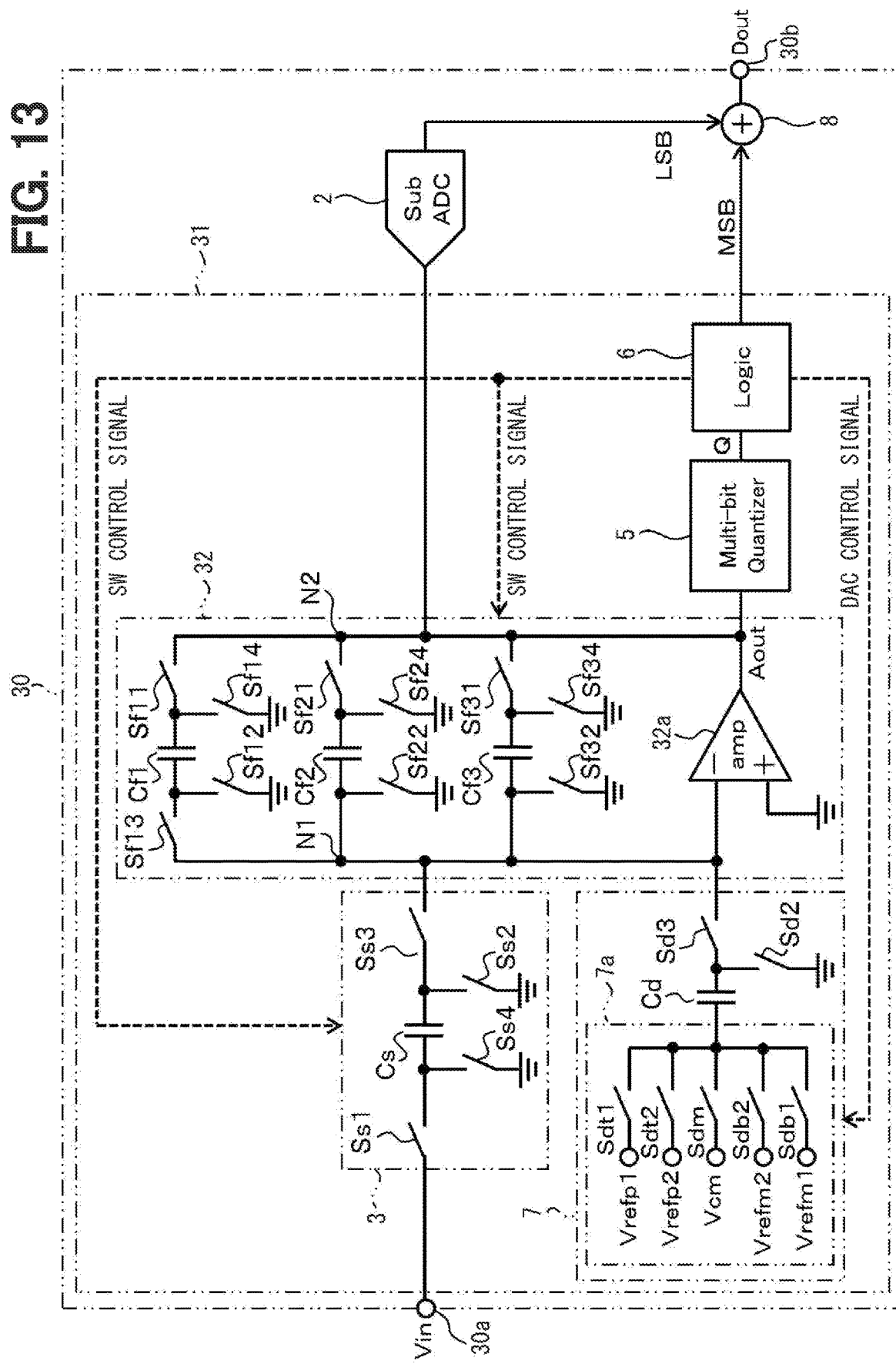
FIG. 13 illustrates an electrical structure according to a fifth embodiment.
Figure 14:
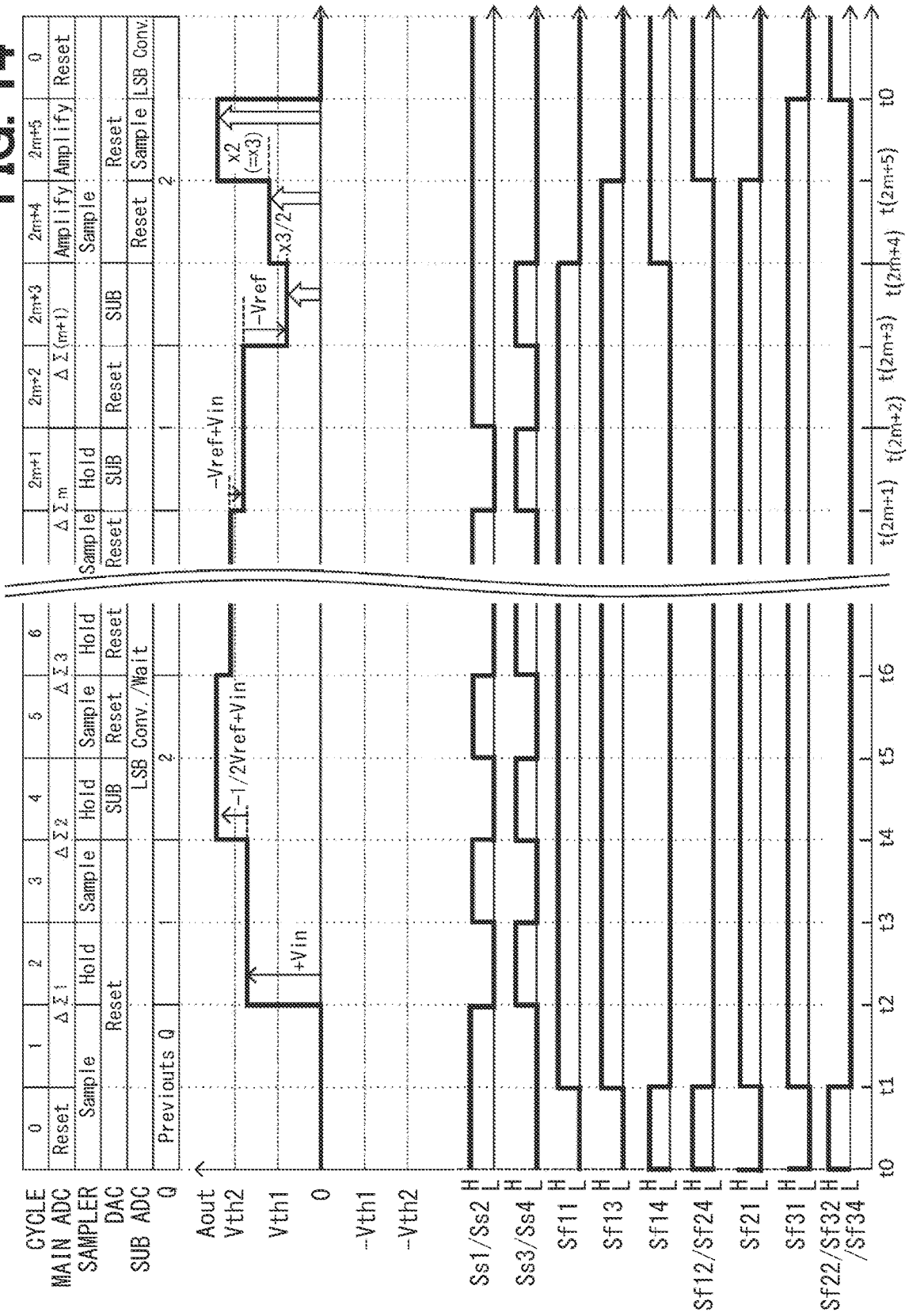
FIG. 14 illustrates a timing chart.

The following describes a fifth embodiment with reference to FIGS. 13, 14, and describes the parts different from those of the first embodiment. In this embodiment, the structure of an integration circuit 32 of a main analog-to-digital converter 31 in an analog-to-digital converter 30 is different from the structure of the integration circuit 4 in the first embodiment.

The integration circuit 32 includes an amplifier 32a, integration capacitors Cf1, Cf2, Cf3 and switches Sf11, Sf12, Sf13, Sf14, Sf21, Sf22, Sf24, Sf 31, Sf32, Sf34. The amplifier 32a has an inverting input terminal connected to the switch Ss3 in the sampler 3 through the node N1, and has a non-inverting input terminal connected to the analog ground. The output terminal of the amplifier 32a is connected to the node N2 and the quantizer 5. The amplifier 32a outputs, as analog output Aout, a result of integration processing performed in accordance with input transferred from the sampler 3 and the digital-to-analog converter 7.

The integration capacitor Cf1 has a terminal connected to the node N1 through the switch Sf13 and connected to the analog ground through the switch Sf12, and has the other terminal connected to the node N2 through the switch sf11 and connected to the analog ground through the switch Sf14. The integration capacitor Cf2 has a terminal connected to the node N1 and connected to the analog ground through the switch Sf22, and has the other terminal connected to the node N2 through the switch sf21 and connected to the analog ground through the switch Sf24.

The integration capacitor Cf3 has a terminal connected to the node N1 and connected to the analog ground through the switch Sf32, and has the other terminal connected to the node N2 through the switch sf31 and connected to the analog ground through the switch Sf34. In the embodiment, the integration capacitors Cf1, Cf2, Cf3 are provided to have the same capacitance. However, the integration capacitors Cf1, Cf2, Cf3 may also have different capacitances.

Next, the processing executed in the above structure is described with reference to FIG. 14. In this embodiment, with regard to the phase of the delta-sigma modulation through the main analog-to-digital converter 31, the operation is similar to the first embodiment until the m-th phase. At this time, in the integration circuit 32, the switches Sf11, Sf13, Sf21, Sf31 are turned on during the operation of the delta-sigma processing, and the operation substantially similar to the one in the first embodiment is executed.

Subsequently, in the main analog-to-digital converter 31, in the (m+1)-th phase, the quantization error of the lowest-order bit in the analog-to-digital conversion processing is output as the analog output Aout. In the subsequent (m+2)-th phase, the main analog-to-digital converter 31 executes the amplification operation over two cycles by the switching control of the switch in the integration circuit 32. In the cycle (2 m+4) of the (m+2)-th phase, the switching control for the switch is executed to amplify the analog output Aout by a factor of 3/2.

In the subsequent cycle (2 m+5), the switching control for the switch is executed to further amplify the analog output Aout, which is amplified by a factor of 3/2 in the previous cycle (2 m+4), by a factor of 2. As a whole, the analog output Aout output from the analog-to-digital converter 30 is amplified by a factor of 3 in the (m+1)-th phase is output to the sub analog-to-digital converter 2 through the node N2. The sub analog-to-digital converter 2 executes the analog-to-digital conversion processing for a low-order bit LSB based on the analog output Aout amplified by a factor of three at the node N2.

According to the fifth embodiment, three integration capacitors Cf1 to Cf3 are provided at the main analog-to-digital converter 31, and the analog output is amplified at multiple steps over multiple cycles after the completion of the delta-sigma modulation. For example, in this embodiment, the analog output is amplified by a factor 3/2, in other words, 1.5 in the first step, and the analog output is further amplified by a factor of 2 in the second step. As a result, the analog output is amplified by a factor of 3 as a whole. As a result, it is possible to ease the power of the amplifier 32a of the integration circuit 32.

Sixth Embodiment

Figure 15:
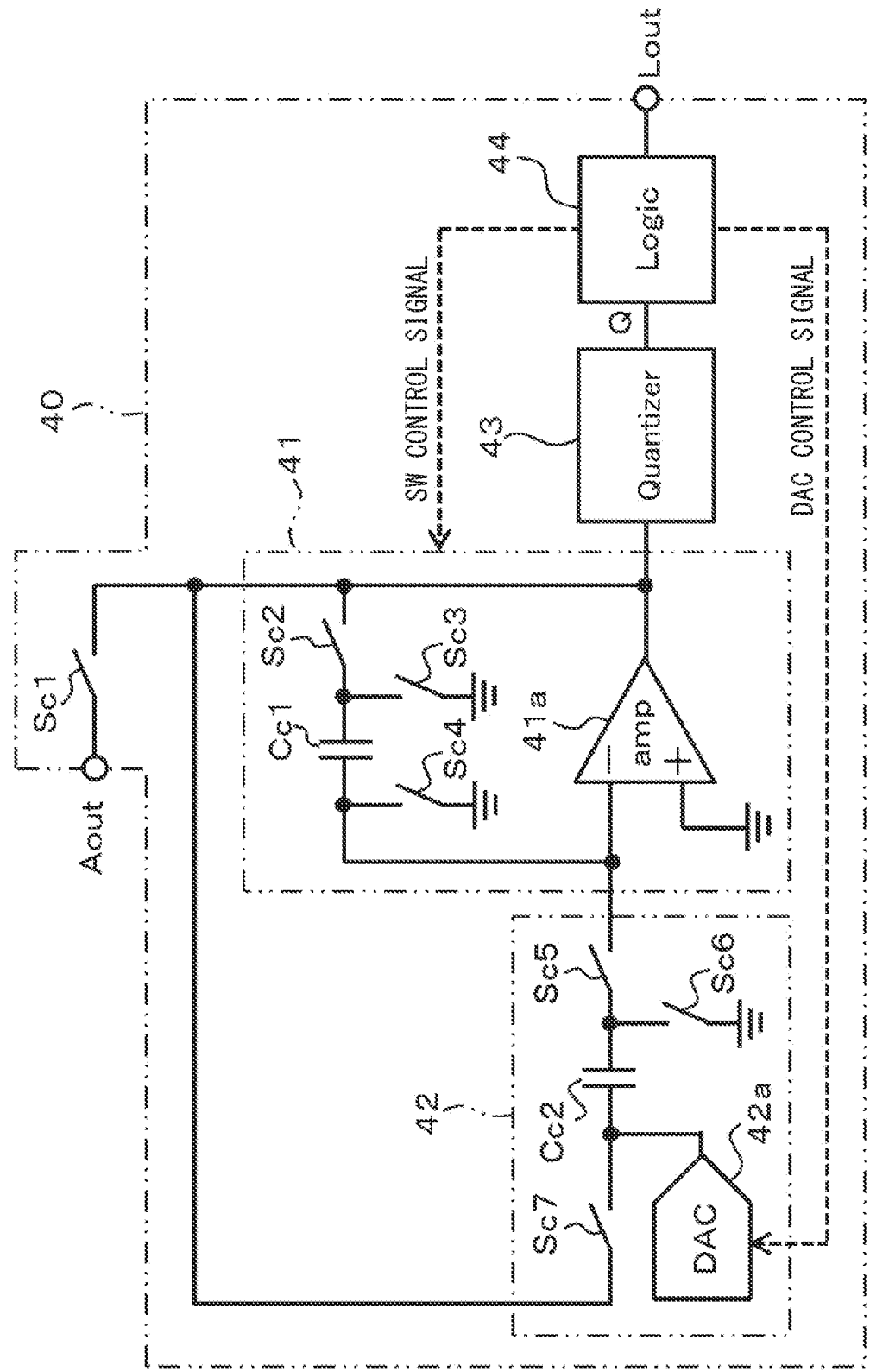
FIG. 15 illustrates an electrical structure according to a sixth embodiment.

The following describes a sixth embodiment with reference to FIG. 15, and describes the parts different from those of the first embodiment. This embodiment describes an example in a case where the device adopted as the sub analog-to-digital converter 2 is constructed by a cyclic analog-to-digital converter 40.

As illustrated in FIG. 15, the cyclic analog-to-digital converter 40 includes an integration circuit 41, a sampler 42, a quantizer 43 and a logic circuit 44. The analog output Aout of the main analog-to-digital converter 1 is incorporated internally through the switch Sc1.

The integration circuit 41 includes an amplifier (amp) 41a, an integration capacitor Cc1, and switches Sc2, Sc3, Sc4. The amplifier 41a has an inverting input terminal connected to the sampler 42, and has a non-inverting input terminal connected to the analog ground. The output terminal of the amplifier 41a is connected to the switch Sc1, and is connected to the quantizer 43. The amplifier 41a outputs, as analog output Aout, a result of integration processing performed in accordance with an input from the sampler 42.

The integration capacitor Cc1 has a terminal connected to the inverting input terminal of the amplifier 41a and connected to the analog ground through the switch Sc4, and has the other terminal connected to the output terminal of the amplifier 41a through the switch Sc2 and connected to the analog ground through the switch Sc3.

The sampler 42 includes a digital-to-analog converter (DAC) 42a, a sampling capacitor Cc2 and three switches Sc5 to Sc7. The switch Sc7 has a terminal connected to the switch Sc1, and has the other terminal connected to the integration circuit 41 through the sampling capacitor Cc2 and the switch Sc5 connected in series. An input side of the sampling capacitor Cc2 is connected to the output terminal of the DAC 42a. An output side of the sampling capacitor Cc2 is connected to the analog ground as the reference standard potential through the switch Sc6.

The cyclic analog-to-digital converter as the sub analog-to-digital converter with the above structure can acquire the low-order bit LSB by executing cyclic processing multiple times for the analog output Aout received through the switch Sc1.

Seventh Embodiment

Figure 16:
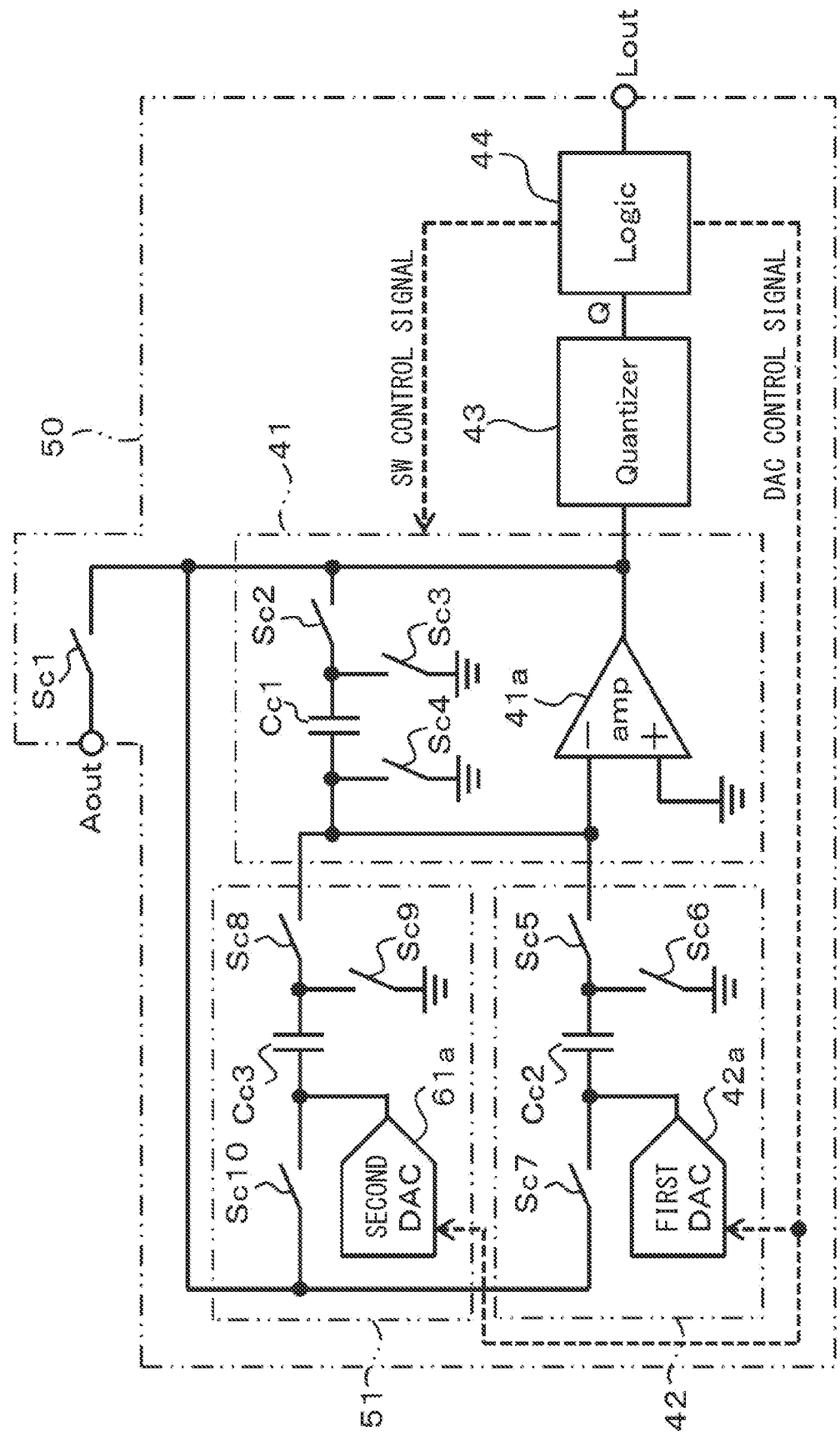
FIG. 16 illustrates an electrical structure according to a seventh embodiment.

The following describes a seventh embodiment with reference to FIG. 16, and describes the parts different from those of the sixth embodiment. This embodiment describes a second example in a case where the device adopted as the sub analog-to-digital converter is constructed by a cyclic analog-to-digital converter 50. The cyclic analog-to-digital converter 50 includes the sampler 42 and another sampler 51.

As illustrated in FIG. 16, the cyclic analog-to-digital converter 50 has the sampler 42 that may be referred to as a first sampler 42, and has the sampler 51 that may be referred to as a second sampler 51. The structure of the second sampler 51 is similar to the structure of the first sampler 42. The second sampler 51 has a digital-to-analog converter (DAC) 51a, a sampling capacitor Cc3, and three switches Sc8 to Sc10.

The DAC 42a of the first sampler 42 is provided as a first DAC 42a, and the DAC 51a of the second sampler 51 is provided as a second DAC 51a. The first sampler 42 and the second sampler 51 are controlled through the logic circuit 44 to alternately execute the cycle of the sample processing and the cycle of the hold processing.

By adopting the above structure, since the cyclic analog-to-digital converter is provided with the first sampler 42 and the second sampler 51 to execute the sample operation alternately, it is possible to expedite the entire processing speed while ensuring the sampling time.

Eighth Embodiment

Figure 17:
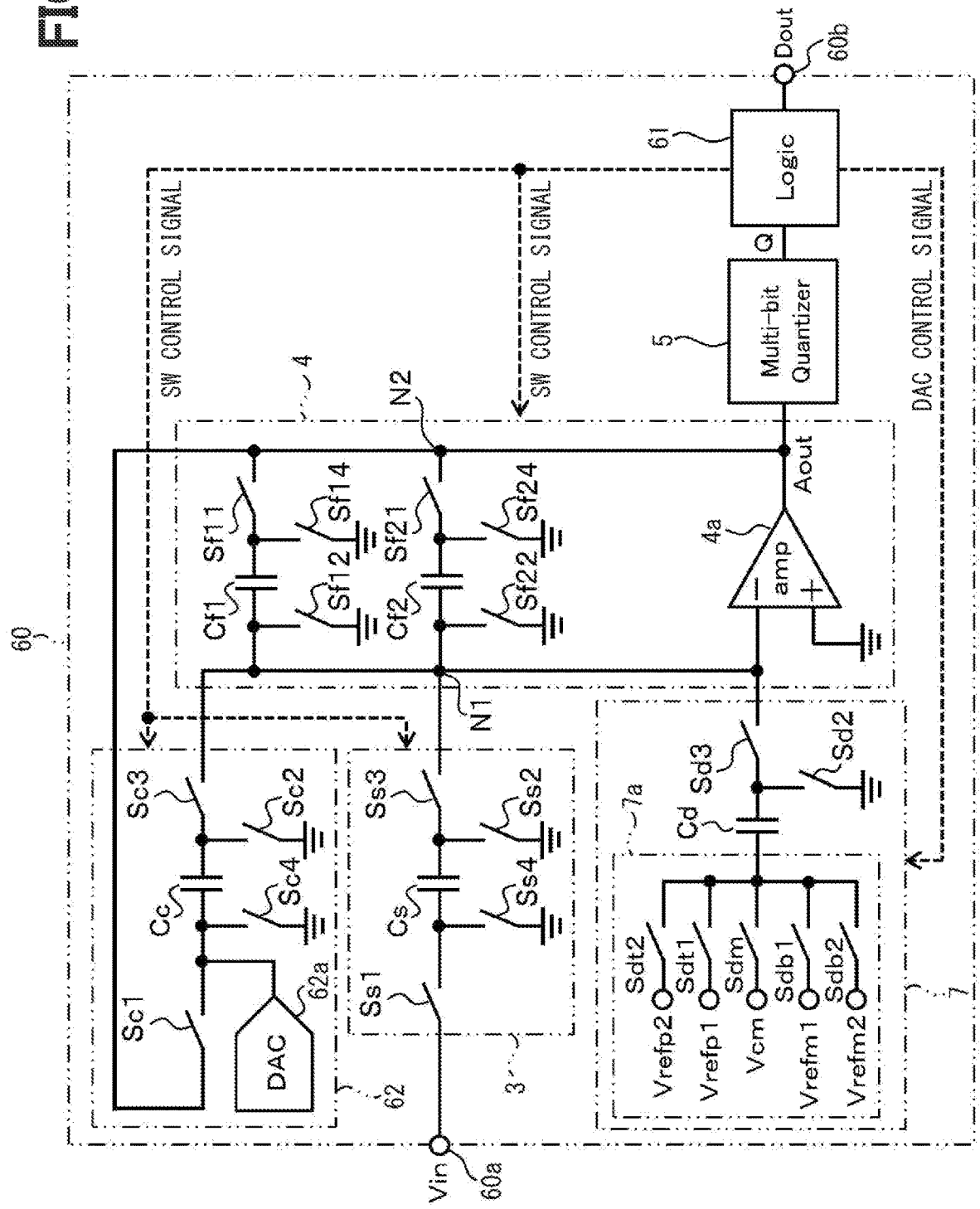
FIG. 17 illustrates an electrical structure according to an eighth embodiment.
Figure 18:
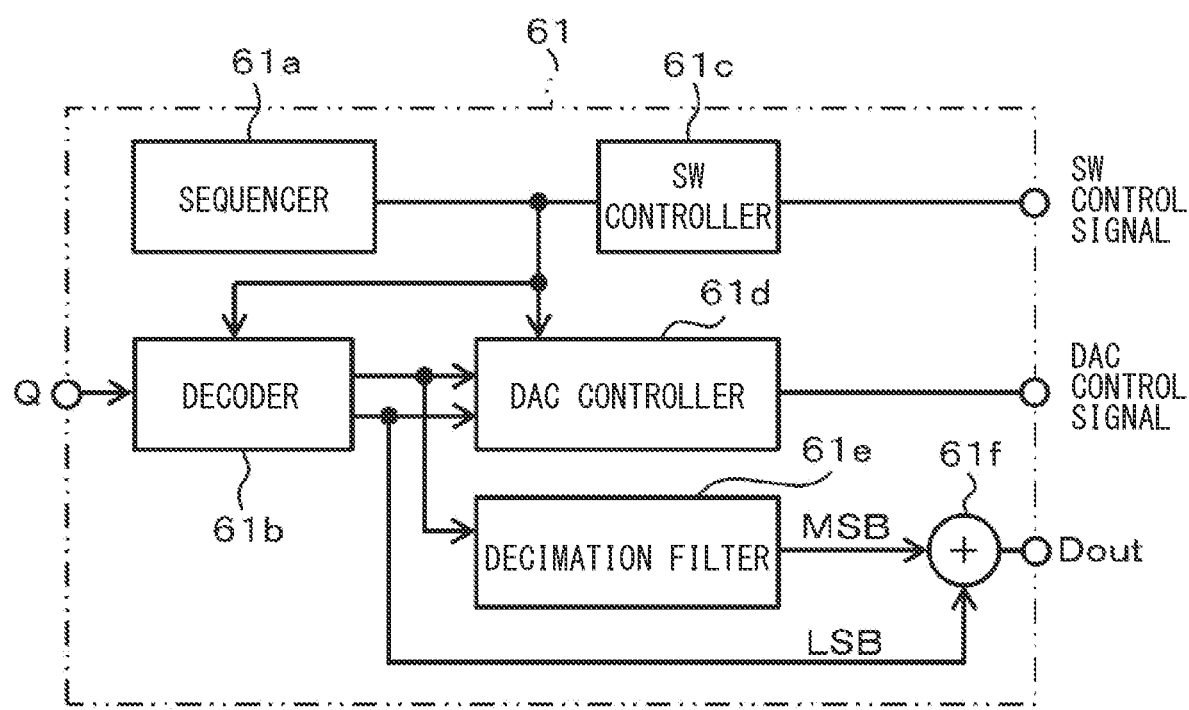
FIG. 18 illustrates a block diagram of a logic circuit.

The following describes an eighth embodiment with reference to FIGS. 17, 18, and describes the parts different from those of the first embodiment. In this embodiment, the integration circuit is commonly shared between the sub analog-to-digital converter 2 and the main analog-to-digital converter.

An analog-to-digital converter 60 includes the sampler 3, the integration circuit 4 and the quantizer 5 that are also included in the main analog-to-digital converter 1, and has a logic circuit 61. A sampler 62 is provided as a sub analog-to-digital converter. The sub analog-to-digital converter adopts the sampler 62, the integration circuit 4, the quantizer 5 and the logic circuit 61. The integration circuit 4, the quantizer 5 and the logic circuit 61 are commonly shared.

The logic circuit 61 executes the operational control of the sampler 3, the integration circuit 4, and executes the operation control of the sampler 62 included in the sub analog-to-digital converter. As illustrated in FIG. 18, as similar to the first embodiment, the logic circuit 61 includes a sequencer 61a, a decoder 61b, a switch (SW) controller 61c, a digital-to-analog controller 61d and a decimation filter 61e as functional blocks. The logic circuit 61 also has an adder 61f.

In the logic circuit 61, as the result of executing the delta-sigma modulation through the main analog-to-digital converter, the output signals Vout1, Vout2 provided as the quantization result Q are decoded by the decoder 61b, and then the result in which the output signal MSB of the high-order bit is generated in the decimation filter 61e is output to the adder 61f.

In contrast, as a result of executing the cyclic analog-to-digital conversion processing through the sub analog-to-digital converter, the output signals Vout1, Vout2 provided as the quantization result Q are decoded by the decoder 61b, and then the result in which the acquired output signal LSB of the low-order bit is output to the adder 8 without passing through the decimation filter 61e.

The logic circuit 61 outputs the SW control signal for controlling the switch in the sampler 62 included in the sub analog-to-digital converter and the switches respectively in the sampler 3 and the integration circuit 4 through the SW controller 61c based on the sequence signal provided from the sequencer 61a.

The sampler 62 included in the sub analog-to-digital converter includes a sampling capacitor Cc and four switches Sc1 to Sc4. The switch Sc1 being an input terminal has a terminal connected to the node N2 of the integration circuit 4, and has the other terminal connected to the integration circuit 4 through the sampling capacitor Cc and the switch Sc3 connected in series. An input side of the sampling capacitor Cc is connected to an analog ground as a reference potential through a switch Sc4. An output side of the sampling capacitor Cs is connected to an analog ground as the reference standard potential through the switch Sc2. The logic circuit 61 controls the switching operation for turning on or off the four switches Sc1 to Sc4. The analog ground is not limited to 0 V, and may be a predetermined potential set as the reference potential.

With the above structure, it is possible to acquire the output of the high-order bit MSB by repeatedly executing the delta-sigma modulation through the sampler 3, the integration circuit 4, the quantizer 5, the logic circuit 61 and the digital-to-analog converter 7 included in the main analog-to-digital converter for the input voltage Vin provided to the input terminal 60a.

Subsequently, it is possible to acquire the output of the low-order bit LSB by providing the analog output Aout of the quantization error acquired by the processing (LSB Conv.) in the main analog-to-digital converter and executing the cyclic analog-to-digital conversion processing with the integration circuit 4, the quantizer 5 and the logic circuit 61.

At this time, since the both functions of the main analog-to-digital converter and the sub analog-to-digital converter can be executed without using the integration circuit 4 and the quantizer 5 at the same time, it is possible to acquire the output signals MSB and LSB without interfering the operation. Finally, in the logic circuit 61, it is possible to combine the output signals MSB and LSB to acquire the digital output Dout through the adder 61f.

According to the eighth embodiment, since the integration circuit 4, the quantizer 5 and the logic circuit 61 in the structure of the sub analog-to-digital converter are commonly shared with the structure of the main analog-to-digital converter, it is possible to construct a compact-sized analog-to-digital converter while attaining substantially identical advantageous effects.

Other Embodiments

The present disclosure should not be limited to the embodiments described above. Various embodiments may further be implemented without departing from the scope of the present disclosure, and may be modified or expanded as described below.

Each of the above embodiments describes a single-ended circuitry structure. However, a differential circuitry structure may be adopted. In each of the above embodiments, it is possible to set the amplification of the analog output of the main analog-to-digital converter to an appropriate level.

The multibit processing through the main analog-to-digital converter may be for three bits or more. Similarly, in the multi-rate processing, it is also possible to execute the quantization processing and the digital-to-analog processing three or more times in a single phase. The amplification cycle in the main analog-to-digital converter may be three or more cycles.

The amplification operation in the main analog-to-digital converter may be executed in three or more steps. Other than the cyclic analog-to-digital converter, the sub analog-to-digital converter may also adopt a variety of types such as sequential comparison type or flash type.

Although the present disclosure has been made in accordance with the embodiments, it is understood that the present disclosure is not limited to such embodiments and structures. The present disclosure covers various modification examples and equivalent arrangements. In addition, various combinations and configurations, as well as other combinations and configurations that include only one element, more, or less, are within the scope and spirit of the present disclosure.

What is claimed is:

1. An analog-to-digital converter comprising:
   a primary converter having 1-bit or 1.5-bit resolution, the primary converter configured to execute conversion processing to convert an analog input signal to a first digital signal through delta-sigma modulation;
   an amplification circuit configured to execute amplification processing to
     amplify analog output of a quantization error of the primary converter, and
     output the analog output that is amplified by the amplification circuit;
   a secondary converter configured to output a second digital signal by converting the analog output that is amplified by the amplification circuit after the conversion processing executed by the primary converter to the second digital signal,
   wherein the primary converter is further configured to execute the delta-sigma modulation a plurality of times to acquire 2-bit or higher resolution,
   wherein the secondary converter is a cyclic analog-to-digital converter, and
   wherein the secondary converter is further configured to have a shorter single phase for processing than the primary converter.

2. The analog-to-digital converter according to claim 1, wherein the amplification circuit is further configured to be included in a structure of the primary converter,
   wherein the primary converter that is acquired with the 2-bit or higher resolution is further configured to execute the conversion processing and the amplification processing, and
   wherein the secondary converter is further configured to output the second digital signal by converting the analog output of the quantization error to the second digital signal after the amplification processing and the conversion processing executed by the primary converter.

3. The analog-to-digital converter according to claim 2, wherein the primary converter is further configured to execute the amplification processing having a longer processing time than the delta-sigma modulation executed once by the primary converter.

4. The analog-to-digital converter according to claim 2, wherein the primary converter is further configured to execute the amplification processing in a plurality of steps.

5. The analog-to-digital converter according to claim 1, wherein the primary converter that is acquired with the 2-bit or higher resolution is configured to execute the delta-sigma modulation a plurality of times to acquire a plurality of high-order bits.

6. The analog-to-digital converter according to claim 1, wherein the cyclic analog-to-digital converter includes a sampler and a digital-to-analog converter, and further includes one or a plurality of additional circuits having an integration circuit configured to be commonly shared with a structure of the primary converter, and
   wherein the cyclic analog-to-digital converter is further configured to execute analog-to-digital conversion processing after end of the conversion processing and the amplification processing.

7. The analog-to-digital converter according to claim 1, wherein the cyclic analog-to-digital converter includes a first converter and a second converter that are configured to alternately execute analog-to-digital conversion processing over a plurality of cycles.

* * * * *